(12) United States Patent
Kalcher et al.

(10) Patent No.: US 12,261,622 B2
(45) Date of Patent: Mar. 25, 2025

(54) CIRCUITRY FOR DIGITAL-TO-ANALOG CONVERSION, DIFFERENTIAL SYSTEMS AND DIGITAL-TO-ANALOG CONVERTER

(71) Applicant: Intel Corporation, Santa Clara, CA (US)

(72) Inventors: Michael Kalcher, Villach (AT); Daniel Gruber, St. Andrae (AT); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 761 days.

(21) Appl. No.: 17/358,152

(22) Filed: Jun. 25, 2021

(65) Prior Publication Data

US 2022/0416806 A1 Dec. 29, 2022

(51) Int. Cl.
*H03M 1/78* (2006.01)
*H03M 1/80* (2006.01)

(52) U.S. Cl.
CPC .................................. *H03M 1/808* (2013.01)

(58) Field of Classification Search
CPC .. H03M 1/785; H03M 1/1057; H03M 1/1061; H03M 1/66; H03M 1/06; H03M 1/687; H03M 1/808; H03M 1/0612; H03M 1/0863; H03M 1/089; H03M 1/68; H03M 1/74; H03M 1/765; H03M 1/00; H03M 1/001; H03M 1/0602; H03M 1/0604; H03M 1/0607; H03M 1/0631; H03M 1/10; H03M 1/1028; H03M 1/1033; H03M 1/70; H03M 1/72; H03M 1/745; H03M 1/747; H03F 2200/03; H03F 2203/45528; H03F 3/183; H03F 3/187; H03F 3/3069; H03F 3/45071; H03F 3/45475; H03H 7/0138; H03H 7/06
USPC .................................................. 341/144–154
See application file for complete search history.

(56) References Cited

U.S. PATENT DOCUMENTS

| | | | | |
|---|---|---|---|---|
| 4,544,912 A * | 10/1985 | Iwamoto | ............ | H03M 1/0612 341/158 |
| 5,714,953 A * | 2/1998 | Mitani | .................. | H03M 1/687 341/154 |
| 7,095,351 B2 * | 8/2006 | Kirby | .................. | H03M 1/1057 341/145 |
| 7,129,878 B1 * | 10/2006 | Shiu | ..................... | H03M 1/0612 341/154 |
| 7,358,886 B2 * | 4/2008 | Saito | ....................... | H03M 1/06 341/154 |
| 7,375,671 B1 * | 5/2008 | Brubaker | ............ | H03M 1/0863 341/145 |
| 8,253,612 B2 * | 8/2012 | Lin | ...................... | H03M 1/1061 341/118 |

(Continued)

*Primary Examiner* — Linh V Nguyen
(74) *Attorney, Agent, or Firm* — 2SPL Patent Attorneys PartG mbB; Kieran O'Leary

(57) ABSTRACT

Circuitry for digital-to-analog conversion is provided. The circuitry includes a driver circuit and a weighting resistor circuit coupled to an output of the driver circuit. The weighting resistor circuit includes a first resistive sub-circuit coupled to the output of the driver circuit and an intermediate node. The weighting resistor further includes a second resistive sub-circuit coupled to the intermediate node and a common node. Further, the weighting circuit includes a third resistive sub-circuit coupled to the intermediate node and an output of the circuitry. The resistivity of the second resistive sub-circuit is equal to or smaller than the resistivity of the first resistive sub-circuit.

15 Claims, 16 Drawing Sheets

(56) References Cited

U.S. PATENT DOCUMENTS

| | | | |
|---|---|---|---|
| 8,860,597 B2* | 10/2014 | Sienko | H03M 1/0863 |
| | | | 341/150 |
| 2005/0270208 A1* | 12/2005 | Kwon | H03M 1/1061 |
| | | | 341/144 |
| 2007/0210949 A1* | 9/2007 | Versari | H03M 1/0607 |
| | | | 341/144 |
| 2017/0201827 A1* | 7/2017 | Kang | H03G 1/0088 |
| 2020/0099389 A1* | 3/2020 | Sung | H03M 1/785 |
| 2020/0119746 A1* | 4/2020 | Wong | H03M 1/66 |
| 2022/0271772 A1* | 8/2022 | Zhang | H03M 1/785 |

* cited by examiner

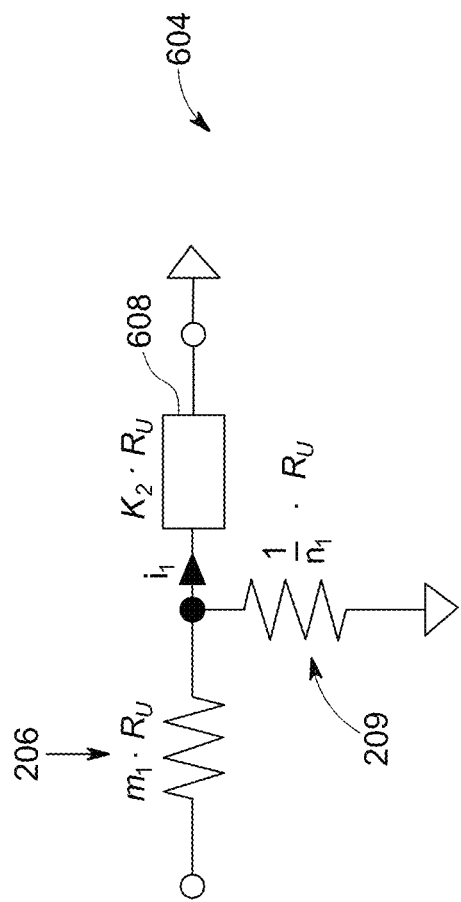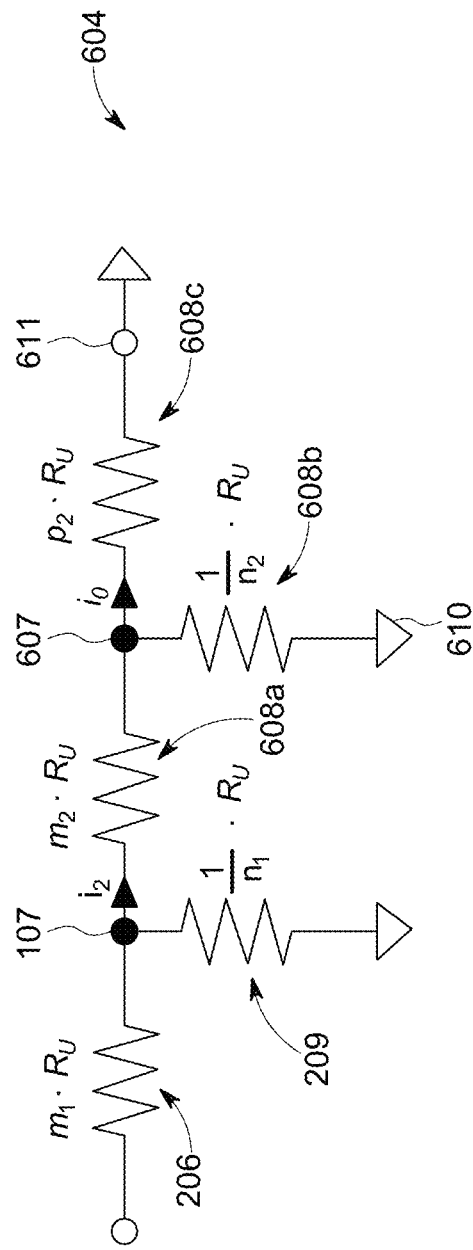
Fig. 6a
Fig. 6b

CIRCUITRY FOR DIGITAL-TO-ANALOG CONVERSION, DIFFERENTIAL SYSTEMS AND DIGITAL-TO-ANALOG CONVERTER

FIELD

The present disclosure relates to digital-to-analog conversion. In particular, examples relate to circuitry for digital-to-analog conversion, a differential system comprising two of the proposed circuitries, a differential system comprising two of the proposed circuitries with interconnected common nodes, a digital-to-analog converter (DAC) system, a transmitter (comprising the circuitry for digital-to-analog conversion, the differential system or the DAC system), a base station comprising the transmitter and a mobile device comprising the transmitter.

BACKGROUND

High-performance digital-to-analog converters (DACs) that are based on resistors usually comprise a number of weighting resistor circuits each coupled to a driver circuit receiving a respective Bit value of a digital input to be converted. Typically, each of the weighting resistor circuits comprises a different resistivity to enable a different scaling factor according to a significance of the respective Bit (e.g. least significant Bit, LSB, most significant Bit, MSB). High DAC resolution is asking for a big range in resistor values and conventional scaling approaches can result in high number of resistors and very different implementations of the weighting resistors for different significance of DAC cells. Accordingly, the physical dimension of the DAC becomes larger and a number of parasitic nodes increases which alters the dynamic behavior of the structure.

Hence, there may be a desire for an improved digital-to-analog conversion.

BRIEF DESCRIPTION OF THE FIGURES

Some examples of apparatuses and/or methods will be described in the following by way of example only, and with reference to the accompanying figures, in which

FIG. 6a illustrates another example of a weighting resistor circuit;

FIG. 6b illustrates another example of a weighting resistor circuit;

DETAILED DESCRIPTION

Figure 1:
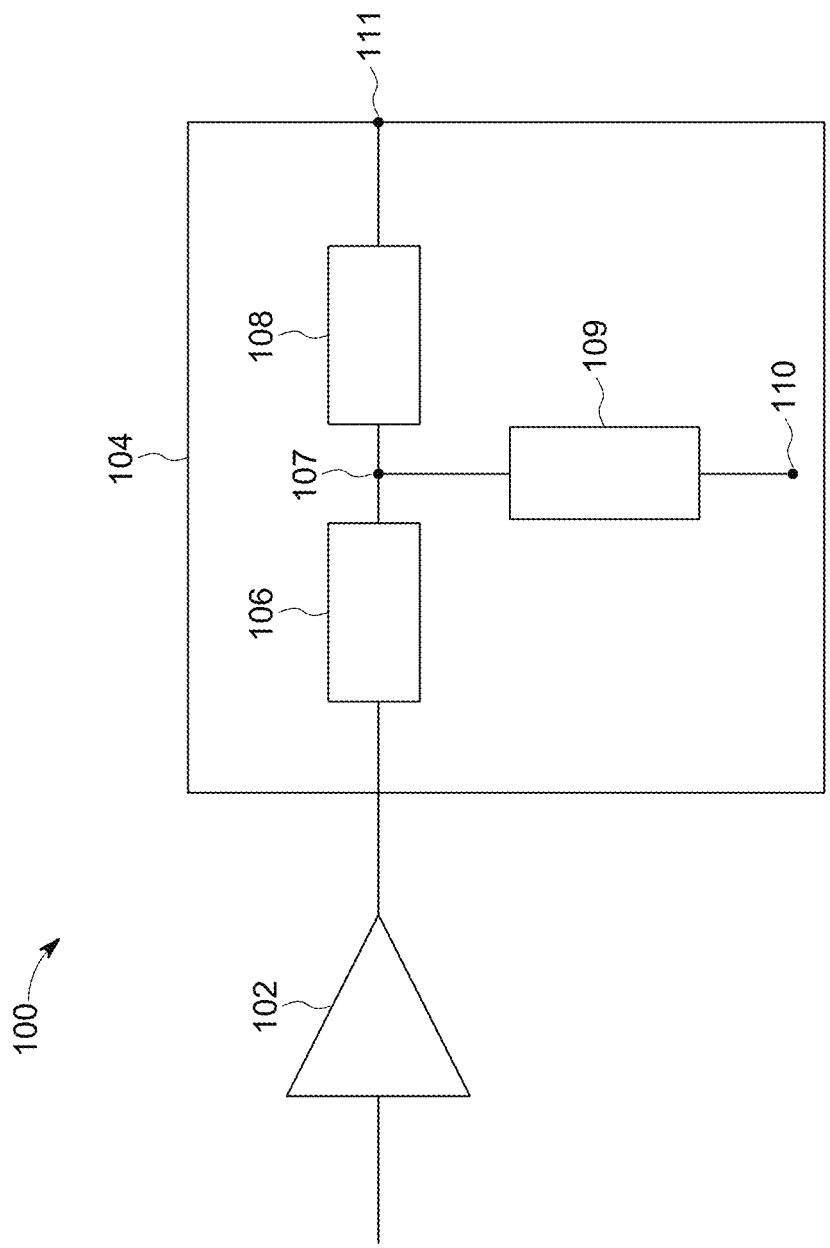
FIG. 1 illustrates an example of a circuitry for digital-to-analog conversion.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 shows an example of circuitry 100 for digital-to-analog conversion. The circuitry 100 comprises a driver circuit 102 and a weighting resistor circuit 104 coupled to an output of the driver circuit 102. The weighting resistor circuit 104 comprises a first resistive sub-circuit 106 coupled to the output of the driver circuit 102 and an intermediate node 107. The weighting resistor circuit 104 further comprises a second resistive sub-circuit 109 coupled to the intermediate node 107 and a common node 110. Further, the weighting resistor circuit 104 comprises a third resistive sub-circuit 108 coupled to the intermediate node 107 and an output 111 of the circuitry 100. The resistivity of the second resistive sub-circuit 109 is equal to or smaller than the resistivity of the first resistive sub-circuit 106.

The driver circuit 102 may be coupled to input circuitry (not shown) receiving a digital input, e.g. a Bit value to be converted by the circuitry 100 to a respective analog signal. Based on the Bit value, the driver circuit 102 may generate a driver signal received by the weighting resistor circuit 104. The weighting resistor circuit 104 may enable a scaling of the received driver signal by means of the resistive sub-circuits 106, 108, 109. Accordingly, a scaling with respect to the significance of the Bit can be provided. The first resistive sub-circuit 106 receives input current from the driver circuit 102. The current is split at the intermediate node 107 into two paths (or branches). The first path comprises the second resistive sub-circuit 109 being coupled to the common node 110. Since the resistivity of the second resistive sub-circuit 109 is equal to or smaller than the resistivity of the first resistive sub-circuit 106, a significant portion of the input current can be directed to the first path. The second path, comprising the third resistive sub-circuit 108, receives only a portion of the input current due to splitting at the intermediate node 107. Accordingly, only a portion of the input current is provided at the output 111 of the circuitry 104. This effectively enables a reduction of the current at the output 111 of the circuitry 100 with respect to the input current. With a reduced current at the output 111 the effective resistance of the weighting resistor circuit 104 can be increased. With the proposed architecture, the weighting resistor circuit 104 can enable a scaling based on the resistivity of each of the sub-circuits 106, 108, 109. For example, the resistivity of each of the sub-circuits 106, 108, 109 may be implemented by unit resistors (rather than a direct scaling) for better accuracy. According to the proposed technique the number of unit resistors and hence area requirements (e.g. silicon area) can be reduced even for higher scaling factors. Further, the number of parasitic capacitances can be reduced and hence a dynamic behavior of the architecture can be improved.

The input of the second resistive sub-circuit 109 couples to the output of the first resistive sub-circuit 106 and to the input of the third resistive sub-circuit 108. This enables a branch at the intermediate node 107. Thereby, input current from the first resistive sub-circuit 106 can be divided at the intermediate node 107 to a first portion with respect to the second sub-circuit 109 and to a second portion with respect to the third sub-circuit 108. The first portion at the second sub-circuit is directed to the common node 110. The path comprising the second resistive sub-circuit 109 connecting to the intermediate node 107 and the common node 110 may be a shunt path. For example, the common node 110 is coupled to ground potential. According to another example, the common node 110 may be coupled to another path, e.g. to enable a differential implementation of the circuitry 100.

The resistivity of the second resistive sub-circuit 109 is equal to or smaller than the resistivity of the first resistive sub-circuit 106 and optionally equal to or smaller than the resistivity of the third resistive sub-circuit 108. The lower resistivity of the second resistive sub-circuit 109 can be achieved, e.g. by (predominantly) parallel connections of signal paths within the second resistive sub-circuit 109. For example, the second resistive sub-circuit 109 comprises at least two signal paths coupled in parallel. Each signal path is coupled between (or to) the intermediate node 107 and the common node 110. Accordingly, the input current can be directed from the intermediate node 107 to several signal paths connecting to the common node 110, e.g. ground node. The number and type of the signal paths in the second resistive subcircuit determines the current at the output 111 of the circuitry 100. Hence, scaling of resistivity of the weighting resistor circuit 104 can be efficiently achieved. The proposed architecture might not need further intermediate (or branching) nodes 107, e.g. upstream of the first resistive sub-circuit 106 and/or downstream of the third resistive sub-circuit 108, to enable a proper scaling. Accordingly, a number of parasitic capacitances can be reduced compared to conventional weighting resistor circuits, e.g. comprising several branching nodes in-between several sub-circuits being coupled in series. Further details on this aspect are described in conjunction with FIGS. 3-4.

The first resistive sub-circuit 106 is downstream of the driver circuit 102 and receives the driver signal. For example, the first resistive sub-circuit 106 comprises (predominantly) a number of resistors coupled in series. The third resistive sub-circuit 108 can be equal, similar or different to the first resistive sub-circuit 106. For example, the third resistive sub-circuit 108 comprises (predominantly) a number of resistors coupled in series. With the current at the output 111 of the circuitry (or the third resistive sub-circuit) and the voltage v between the input of the first resistive sub-circuit 106 and the output of the third resistive sub-circuit 108, the effective resistance of the weighting resistor circuit 104 is (ideally):

$$R_{eff} = v/i_o.$$

This reflects the principle of the proposed architecture which is to reduce the output current $i_o$ to achieve the desired resistance value (or a desired scaling factor).

For example, each resistive sub-circuit 106, 108, 109 comprises a respective number of unit resistors with resistance $R_U$. Using unit resistors may increase the accuracy of the resistivity of each sub-circuit since unit resistors can be manufactured equally and may have a same geometrical size or shape. This can ensure an optimized matching of the resistance values.

The scaling factor of the circuitry 100 (or weighting resistor circuit 104) may be determined by the resistivity of each of the resistive sub-circuits 106, 108, 109. The circuitry 100 may be part of a DAC system. For example, the DAC system comprises a number of the proposed circuities 100 each having a same, different, increasing scaling factor. The circuitry 100 may be usable for a binary or any arbitrary scaling. The circuitry 100 may be useable in combination with conventional circuitries for digital-to-analog conversion, e.g. together forming a N-Bit (e.g. binary or arbitrary) DAC system (with N≥2). One or more circuitries 100 may be useable for a high-speed DAC system, e.g. indicating a frequency in the range of several GHz.

The proposed technique may provide a scaling scheme for high performance DACs that may reduce the number of resistors required, even for large scaling factors. The employed scheme allows for generating arbitrary (e.g. integer) scaling factors, also by only employing unit resistors. The proposed architecture may reduce the silicon area and parasitic capacitance. The dynamic behavior may be improved and easily controllable compared to conventional circuitries for digital-to-analog conversion.

The circuitry 100 may enable a small and feasible implementation of binary (or other scaled) weighted high performance DACs with resistances as their weighting elements. As the implementation can be based on unit resistors, the static resistance accuracy can be guaranteed which is typically a prerequisite for high performance DAC operation. The reduction of resistors may enable a suitable and controllable dynamic behavior of the converter cells and thus its high speed and high bandwidth operation.

Although not explicitly illustrated in FIG. 1, the circuitry 100 may comprise additional or optional circuitry (components). For example, the circuitry 100 may comprise an input circuit receiving the digital input or additional resistive sub-circuits, e.g. being part of the above-described resistive sub-circuits. Some exemplary apparatuses showing further details of the proposed technique will be described in the following with reference to FIGS. 2 to 16.

Figure 2:
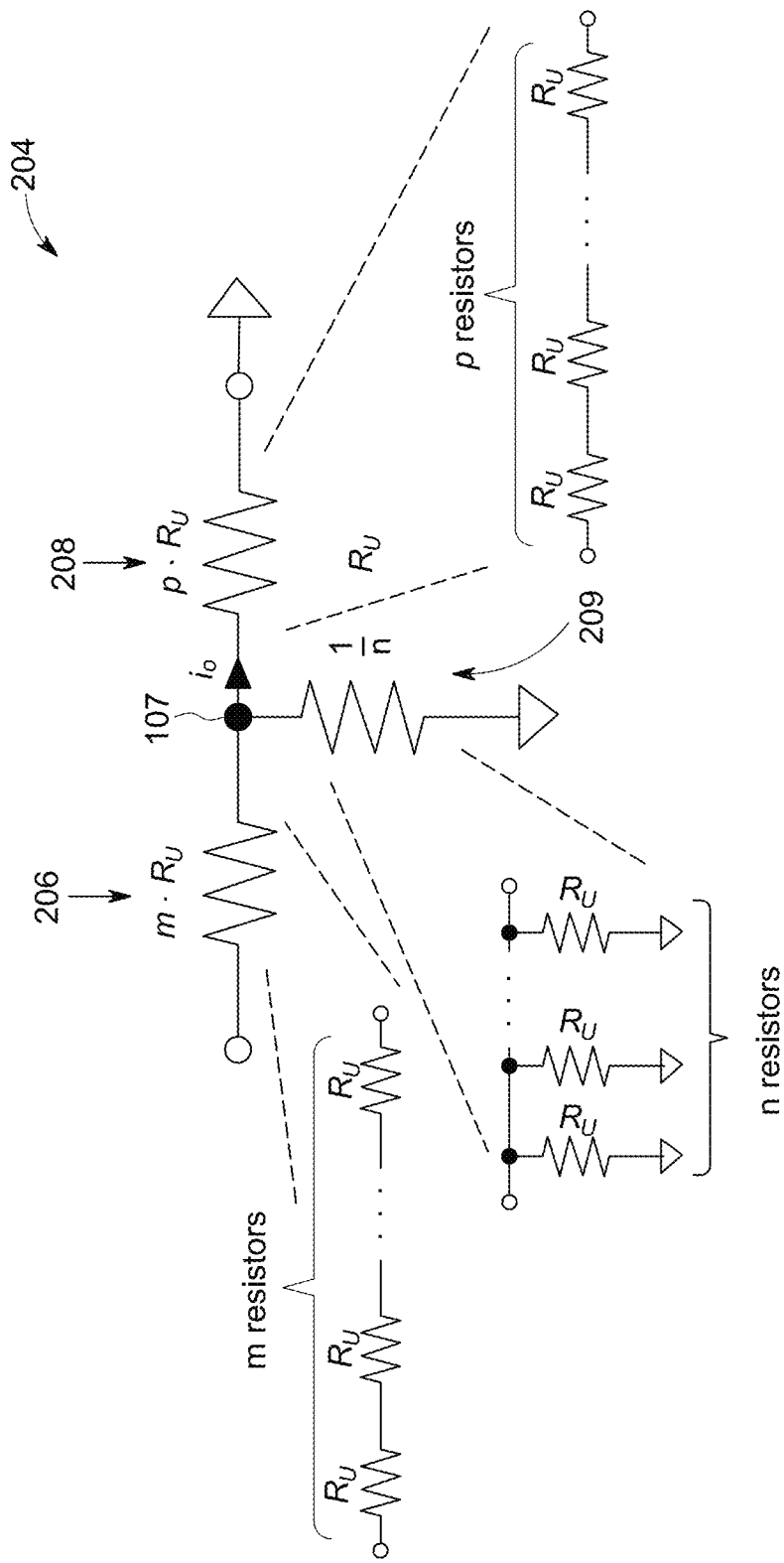
FIG. 2 illustrates an example of a weighting resistor circuit.

FIG. 2 illustrates an example of a weighting resistor circuit 204. The implementation of the weighting resistor circuit 204 may be similar to the implementation of the weighting resistor circuit 104 described in connection with FIG. 1. The weighting resistor circuit 204 comprises a first resistive sub-circuit 206, a second resistive sub-circuit 209 and a third resistive sub-circuit 208. According to the example, each of the sub-circuits 206, 208, 209 comprises one or more unit resistors with resistivity $R_U$. A resistivity of the first resistive sub-circuit 206 is equal to m $R_U$ related to the respective number of unit resistors. A resistivity of the second resistive sub-circuit 209 is equal to 1/n $R_U$ related to the respective number of unit resistors. A resistivity of the third resistive sub-circuit 208 is equal to p $R_U$ related to the respective number of unit resistors. A resistivity $R_{eff}$ of the weighting resistor circuit 204 is based on $R_U \cdot (n \cdot m \cdot p + m + p)$. Generally, the numbers n, m and p can be integers or non-integers.

Similarly, as described above, the first resistive sub-circuit 206 may be connectable to an output of a driver circuit. The output of the first resistive sub-circuit 206, the input of the second resistive sub-circuit 209 and the input of the third resistive sub-circuit 208 is connected to the intermediate node 107. In the example, the second resistive sub-circuit 209 is part of a shunt path coupled to ground potential. With the common node being connected to ground potential, the weighting resistor circuit 204 may be usable for converting single-ended signals.

In the arrangement of the proposed resistor scaling, the second resistive sub-circuit diverts the fraction $(n \cdot p)/(1+n \cdot p)$ of the input current to common node, effectively increasing the resistance towards the output. Therefore, the effective resistance is $$R_{eff} = \frac{v}{i_o} = R_U \cdot (n \cdot m \cdot p + m + p).$$

Hence, the scaling factor of the shown weighing resistor circuit 204 is given by $$K = \frac{R_{eff}}{R_U} = (n \cdot m \cdot p + m + p).$$

As outlined above, the scaling factor K is depending on the resistivity of each resistive sub-circuit 206, 208, 209. The weighting resistor circuit 204 can enable an arbitrary scaling factor. The product term can boost the effective resistance, especially for large scaling factors.

As exemplarily shown, the first resistive sub-circuit 206 comprises m (e.g. m≥1) unit resistors coupled in series. In the particular example, m is an integer. Due to the series connection of m unit resistors, the resistivity of the first resistive sub-circuit is (ideally) m $R_U$.

As exemplarily shown, the second resistive sub-circuit comprises n (e.g. n≥1) unit resistors coupled in parallel. In the particular example, n is an integer. Due to the parallel connection of n unit resistors, the resistivity of the second resistive sub-circuit is (ideally) 1/n $R_U$. Accordingly, the resistivity of the second resistive sub-circuit 209 is equal to or smaller than the resistivity of the first resistive sub-circuit 206.

As exemplarily shown, the third resistive sub-circuit 208 comprises p (e.g. p≥1) unit resistors coupled in series. In the particular example, p is an integer. Due to the series connection of p unit resistors, the resistivity of the third resistive sub-circuit 208 is (ideally) p $R_U$. Accordingly, the resistivity of the second resistive sub-circuit 209 is equal to or smaller than the resistivity of the third resistive sub-circuit 208.

Hence, the proposed architecture in FIG. 2 employs m+n+p resistors (linear in both m and n).

It may be desired to reduce the number of unit resistors in the weighting resistor circuit 204 (to a minimum), e.g. to reduce the size of the weighting resistor circuit 204 (and hence the circuitry for digital-to-analog conversion or a differential system or a DAC system comprising the circuitry for digital-to-analog conversion), to reduce the number of error sources or to improve the dynamic behavior of the weighting resistor circuit 204. For this, the scaling factor $$\frac{R_{eff}}{R_U} = (n \cdot m \cdot p + m + p)$$

of the weighting resistor circuit 204 may be based on min(n+m+p) with m, n and p being integers (such that K=n·m·p+m+p). With this condition, the scaling factor of the weighting circuit can be achieved with a minimum of unit resistors.

To realize any integer scaling factor K, e.g. for binary scaling K=2' (or an arbitrary scaling e.g. 3', $4^k$, $5^k$, $8^k$, $16^k$ etc.), one can chose (integer) m, n and p accordingly such that $K=2^k=n \cdot m \cdot p+m+p$. For a suitable choice of m, n and p the number of unit resistors $R_U$ can be lower than in a conventional architecture (e.g. linear scaling weighting resistor circuit, R-2R scaling weighting resistor circuit). Therefore, the proposed resistors scaling can minimize or at least reduce the necessary silicon area for a given scaling factor.

Figure 3:
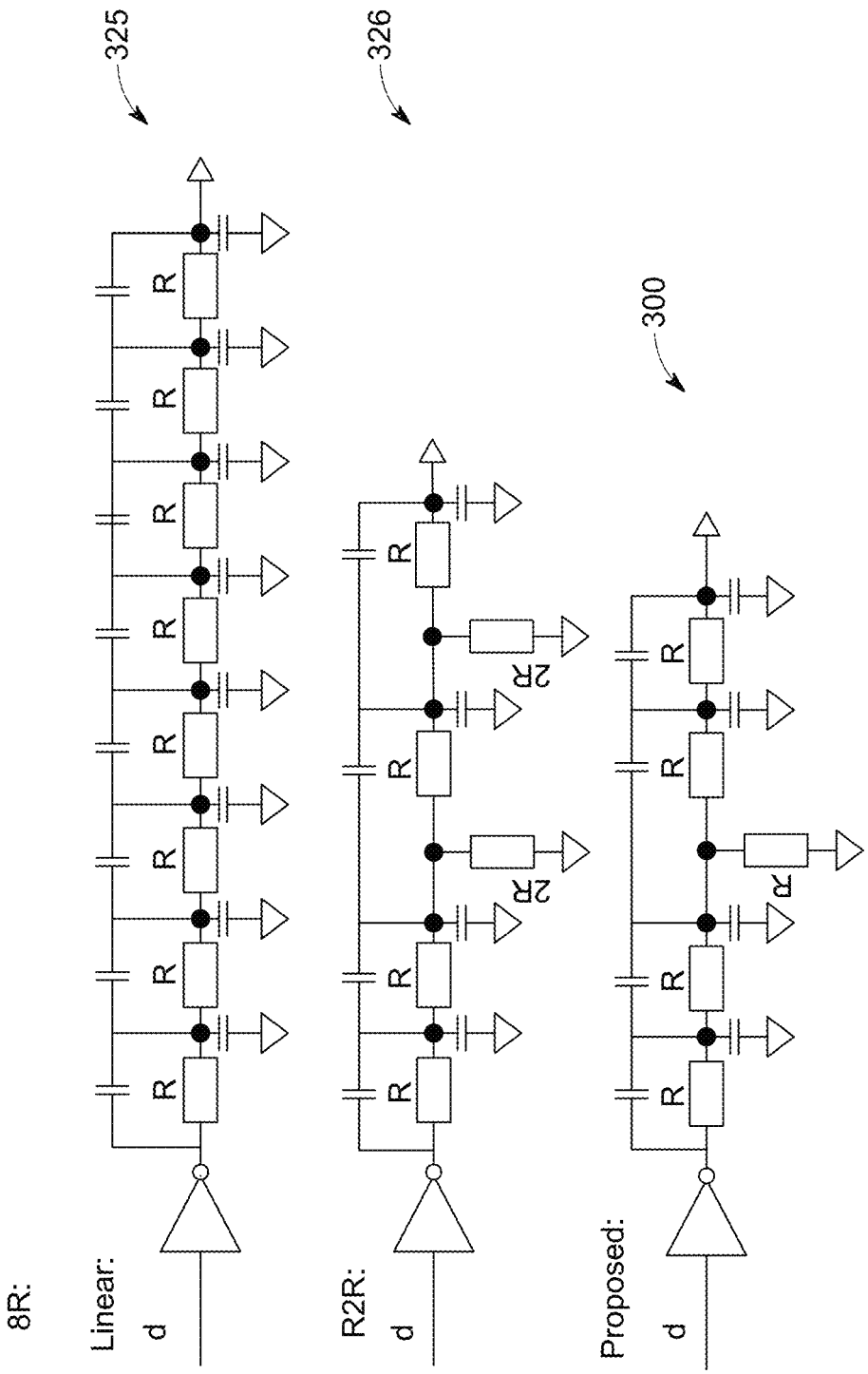
FIG. 3 illustrates another example of a circuitry for digital-to-analog conversion in comparison to conventional circuitries for digital-to-analog conversion.

FIG. 3. shows another example of a circuitry for digital-to-analog conversion 300 in comparison to a conventional linear scaling circuitry 325 and to a conventional R-2R scaling circuitry 326. The scaling factor of the proposed circuitry 304 is equal to the scaling factor of the linear scaling circuitry 325 and the R-2R scaling circuitry 326. Compared to the conventional scaling circuities 325, 326, the proposed circuitry 300 comprises significantly less unit resistors R to achieve the same scaling factor of K=8. As indicated by the capacitors, also the number of parasitic capacitances is reduced in comparison to the linear scaling architecture.

Figure 4:
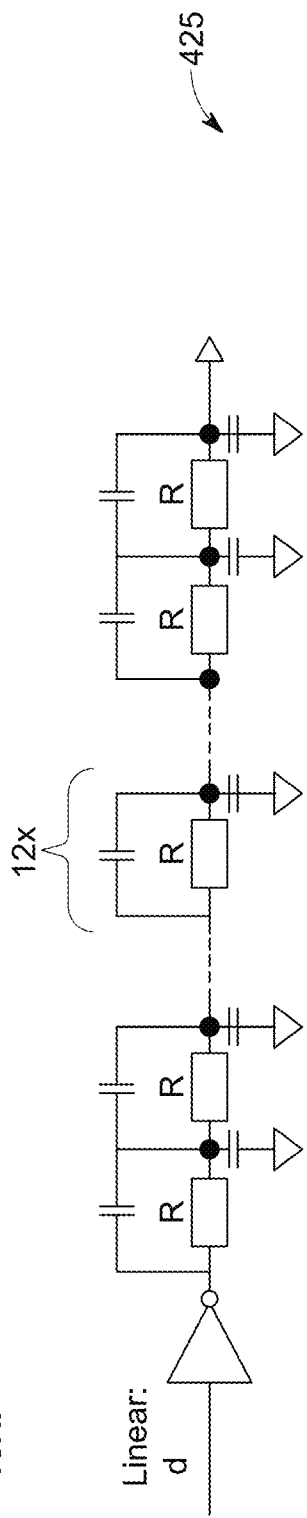
FIG. 4 illustrates another example of a circuitry for digital-to-analog conversion in comparison to conventional circuitries for digital-to-analog conversion.
Figure 4:
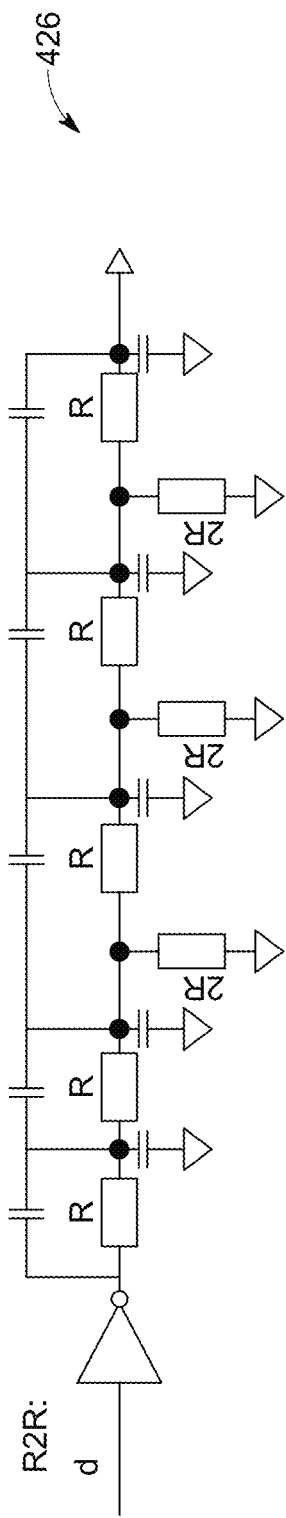
Figure 4:
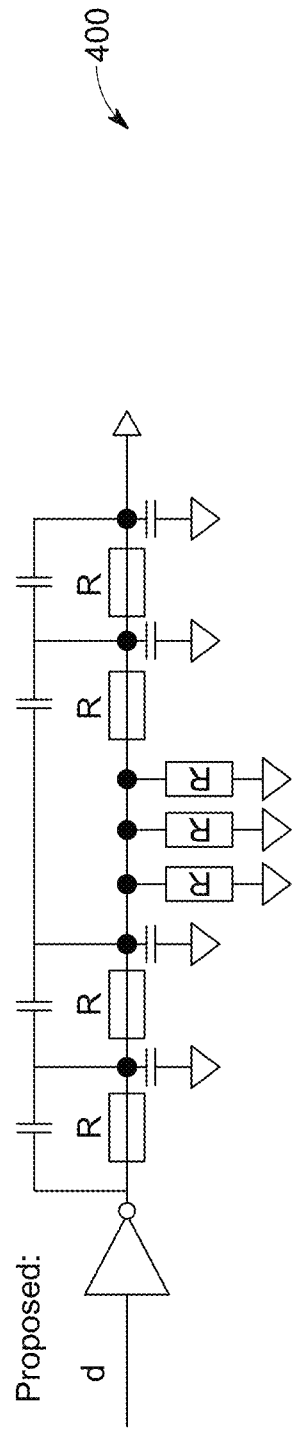

FIG. 4 shows another example of a circuitry for digital-to-analog conversion 400 in comparison to a conventional linear scaling circuitry 425 and to a conventional R-2R scaling circuitry 426 with respect to a higher scaling factor being K=16. The aspect of reduced number of unit resistors R and reduced number of parasitic capacitances becomes even more significant for a greater scaling factor.

The proposed technique may be used to reduce the number of nodes, especially series nodes between driver circuit and output of the circuitry. This number of these series nodes in the linear architecture and the R2R-architecture can be higher than in the proposed architecture.

Some example configurations for m, n, and p for binary scaling with a minimum number of unit resistors $R_U$ and the respective number of unit resistors in the conventional R-2R configuration are given in Fehler! Verweisquelle konnte nicht gefunden werden.:

TABLE 1

| K | n | m | p | n + m + p | R-2R |
|---|---|---|---|---|---|
| 4 | 2 | 1 | 1 | 4 | 5 |
| 8 | 1 | 2 | 2 | 5 | 8 |
| 16 | 3 | 2 | 2 | 7 | 11 |
| 32 | 2 | 2 | 6 | 10 | 14 |
| 64 | 6 | 1 | 9 | 16 | 17 |

TABLE 1-continued

| K | n | m | p | n + m + p | R-2R |
|---|---|---|---|---|---|
|  | 8 | 1 | 7 | 16 | 20 |
| 128 | 8 | 3 | 5 | 16 | 23 |
| 256 | 4 | 6 | 10 | 20 | 26 |

As shown in Table 1, the proposed architecture enables a reduction of unit resistors in comparison to the conventional R-2R configuration. This aspect becomes even more significant for higher scaling factors. Further, for a particular scaling factor (e.g. K=64) there can be more than one configuration according to the proposed technique. Also, the values for m and p can be exchanged. It can be further seen that the minimum number of unit resistor for the scaling factors K=64 and K=128 can remain the same.

Furthermore, some other examples for non-binary scaling with minimum number of unit resistors are shown in Table 2.

TABLE 2

| K | n | m | p | n + m + p |
|---|---|---|---|---|
| 5 | 1 | 1 | 2 | 4 |
| 10 | 2 | 1 | 3 | 6 |
| 13 | 2 | 1 | 4 | 7 |
|  | 3 | 1 | 3 | 7 |
| 15 | 1 | 3 | 3 | 7 |
| 21 | 3 | 1 | 6 | 10 |
|  | 4 | 1 | 4 | 10 |
| 29 | 4 | 2 | 3 | 9 |
| 60 | 2 | 5 | 5 | 12 |
|  | 6 | 3 | 3 | 12 |

Hence, arbitrary scaling factors are possible with the proposed architecture.

As described above, the minimum number of individual unit resistors $R_U$ as well as the minimum silicon area may also reduce the parasitic capacitance. This property can be especially relevant for large scaling factors, since the dynamic performance may be less degraded compared to the other approaches. Furthermore, the circuit structure of the proposed resistor scaling approach can always remain the same, independently of the scaling factor: there is always a single shunt path with a single current forking node. Since the structure can be always equal, it can be much easier to control the dynamic behavior of the scaled resistance. Contrary, e.g. in the R-2R approach, for a scaling factor of $2^k$, there are k−1 shunt paths and thus k−1 current forking nodes, which may increase the difficulty to control the dynamic behavior of the scaled resistances.

It is to be understood that the proposed implementation is not limited to unit resistors $R_U$. The resistive sub-circuits can be also directly scaled, or a mixture of unit and scaled resistors can be used.

More details and aspects are mentioned in connection with the examples described above or below. The example shown in FIGS. 2, FIG. 3 (with respect to the proposed circuitry 300) and FIG. 4 (with respect to the proposed circuitry 400) may comprise one or more optional additional features corresponding to one or more aspects mentioned in connection with the proposed technique or one or more examples described above (e.g. FIG. 1) or below (e.g. FIGS. 5-15).

Figure 5:
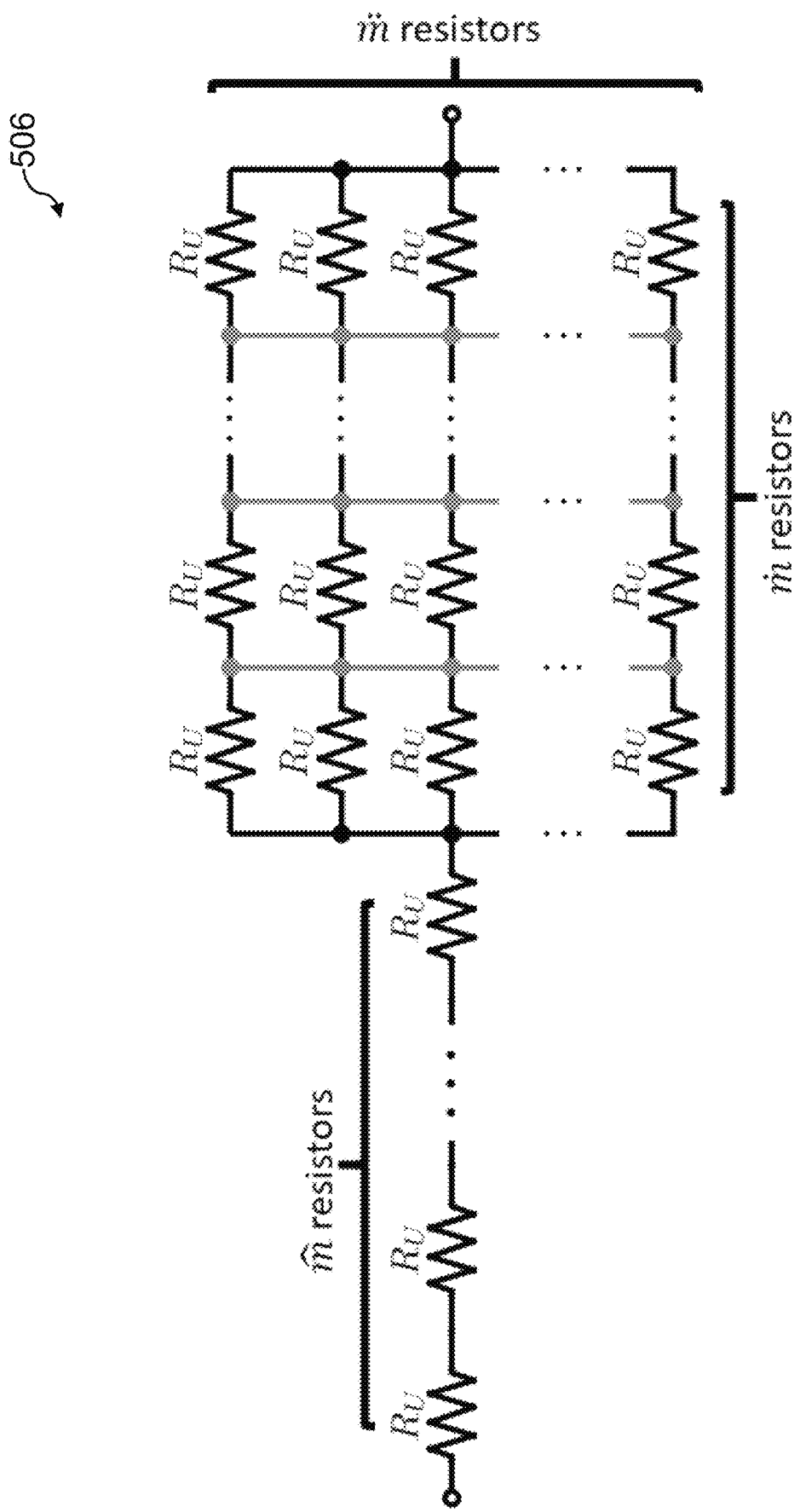
FIG. 5 illustrates an example of a resistive sub-circuit.

FIG. 5 illustrates an example of a (e.g. first or third) resistive sub-circuit 506. The implementation of the resistive sub-circuit 506 may be similar to the implementation of the (e.g. first or third) resistive sub-circuit 106, 108, 206, 208 (or those of the proposed circuitries 300, 400) described in connection with FIG. 1-4. The proposed architecture exemplarily given in FIG. 5 may enable a non-integer multiple of the unit resistor as a resulting resistivity of the resistive sub-circuit 506. As described above, scaling factors of the circuitry is not restricted to integers. Accordingly, non-integer scaling factors can be achieved with non-integer values m, n, p or a combination thereof. For this, e.g. the respective number of unit resistors of at least one of the first resistive sub-circuit and second resistive sub-circuit and third resistive sub-circuit are coupled in series and in parallel.

FIG. 5 shows a unit resistor arrangement for non-integer factors m and p by way of an example only. Hence, non-integer m, n, and p can be used by combining series and parallel circuits of the unit resistor $R_U$. E.g., m=m̂+ṁ/m̈, where m̂ parallel resistors are connected ṁ times in series, in series with m unit resistors, as given in FIG. 5. Similarly, this can apply also to n and p. For n the series and parallel connections may need to be interchanged. According to the proposed example, fractional scaling factors can be realized by employing (e.g. exclusively) unit resistors.

More details and aspects are mentioned in connection with the examples described above or below. The example shown in FIG. 5 may comprise one or more optional additional features corresponding to one or more aspects mentioned in connection with the proposed technique or one or more examples described above (e.g. FIG. 1-4) or below (e.g. FIGS. 6-15).

FIG. 6a-b illustrates another example of a weighting resistor circuit 604. The implementation of the weighting resistor circuit 604a-b may be similar to the implementation of the weighting resistor circuit described in connection with FIG. 1-5. According to FIG. 6a, the weighting resistor circuit 604 comprises a third resistive sub-circuit 608 with a resistivity $K_2 R_U$. FIG. 6b shows an exemplary implementation of the third resistive sub-circuit 608 (of FIG. 6a) which is again based on the proposed architecture as described above. According to the example, the third resistive sub-circuit 608 comprises a first additional resistive sub-circuit 608a coupled between (or to) the intermediate node 107 and an additional intermediate node 607. A second additional resistive sub-circuit 608b is coupled between (or to) the additional intermediate node 607 and a common node 610. A third additional resistive sub-circuit 608c is coupled between (or to) the additional intermediate node 607 and the output of the circuitry 611. The resistivity of the second additional resistive sub-circuit 608b (e.g. $1/n_2 R_U$) is equal to or smaller than the resistivity of the first additional resistive sub-circuit 608a (e.g. $m_2 R_U$). Hence, the third resistive sub-circuit 608 of the weighting resistor circuit 604 can be again based on the proposed architecture of weighting resistors.

FIGS. 6a-b exemplarily show a scaled weighting resistor circuit 604 comprising another second stage scaled weighting resistor circuit (e.g. according to the implementation shown in FIG. 2) as the third resistive sub-circuit 608 with $p_1=K_2$. Several of the proposed weighting resistor circuits can be connected in series, e.g. to enable a further boost of the effective resistance, and thus a reduction of the number of unit resistors needed. As shown in FIGS. 6a-b, the third resistive sub-circuit 608 (or p output resistors) are replaced by a second weighting resistor circuit stage. This way, the scaling factor $K_2=n_2 \cdot m_2 \cdot p_2+m_2+p_2$ of this second stage is used as $p_1$ and thus multiplied by $m_1$ and $n_1$ of the first stage.

FIG. 6b shows the scaled weighting resistor circuit 604 by employing a cascade of two of the proposed scaled weighted resistor circuits of FIG. 2. The resulting effective resistance of the arrangement of FIG. 6b may be:

$$R_{eff2}=R_U(n_1 \cdot m_1 \cdot K_2+m_1+K_2)=R_U(n_1 \cdot m_1 \cdot n_2 \cdot m_2 \cdot p_2+ n_1 \cdot m_1 \cdot m_2+n_1 \cdot m_1 \cdot p_2+m_1+n_2 \cdot m_2 \cdot p_2+m_2+p_2)$$

For example, to realize a scaling factor of K=1024, $m_1=n_1=4$ and $K_2=60$ can be chosen. Thus, the second stage can be implemented with $m_2=p_2=3$ and $n_2=6$, resulting in the desired resistivity employing only $m_1+n_1+m_2+n_2+p_2=20$ unit resistors $R_U$ and two shunt paths. The respective R-2R implementation would require at least 29 unit resistors and nine shunt paths. Similarly, many more of such stages can be cascaded to further increase the effective resistance while using only a limited number of unit resistors $R_U$.

For example, this aspect can be optionally or alternatively also be valid for the first resistive sub-circuit. Hence, another example may be a first resistive sub-circuit comprising a (or e.g. another) first additional resistive sub-circuit coupled between (or to) the output of the driver circuit and an (or e.g. another) additional intermediate node. A (or e.g. another) second additional resistive sub-circuit is coupled between (or to) the (e.g. other) additional intermediate node and a common node. A (or e.g. another) third additional resistive sub-circuit is coupled between (or to) the (e.g. other) additional intermediate node and the intermediate node. The resistivity of the (e.g. other) second additional resistive sub-circuit is equal to or smaller than the resistivity of the (e.g. other) first additional resistive sub-circuit.

More details and aspects are mentioned in connection with the examples described above or below. The example shown in FIGS. 6a-b may comprise one or more optional additional features corresponding to one or more aspects mentioned in connection with the proposed technique or one or more examples described above (e.g. FIG. 1-5) or below (e.g. FIGS. 7-15).

The above proposed technique can be used for single-ended signals or differential signals. At least two types, based on the proposed architecture, can be used in combination for a differential system for digital-to-analog conversion.

Figure 7:
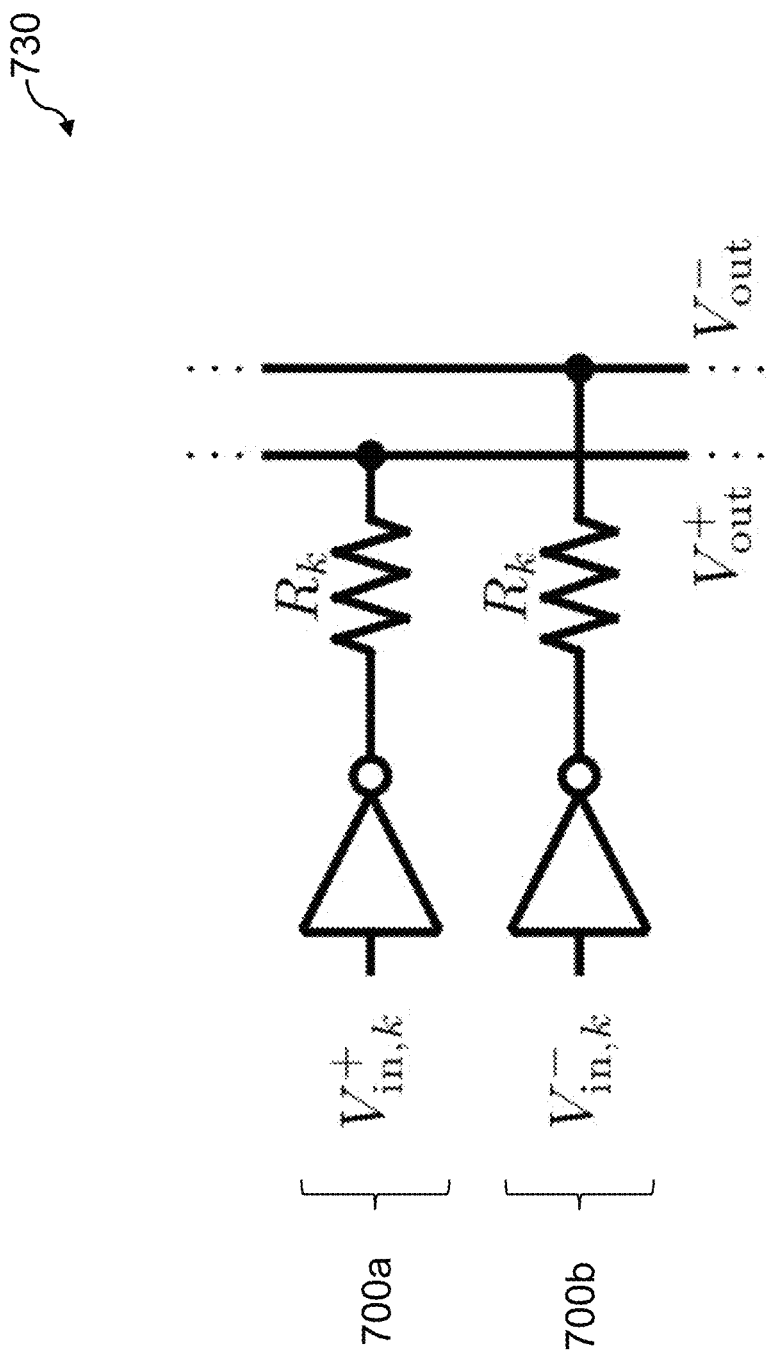
FIG. 7 illustrates an example of a differential system.

FIG. 7 illustrates an example of a differential system 730. The differential system 730 comprises first circuitry 700a for digital-to-analog conversion and second circuitry 700b for digital-to-analog conversion. The implementation of each of the circuitries 700a, 700b may be similar to the implementation of the circuitry for digital-to-analog conversion described in connection with FIG. 1-6 with the common nodes being coupled to ground potential. An output of the weighting resistor circuit of the first circuitry 700a is configured to supply a first output signal (e.g. $V_{out}^{30}$) and an output of the weighting resistor circuit of the second circuitry 700b is configured to supply a second output signal (e.g. $V_{out}^-$). The first and second output signal form a differential signal for the differential system 730. Hence, a differential implementation for a system based on the proposed technique can be achieved by using two of the proposed (single-ended) circuitries each having a common node coupled to ground potential. As shown in FIG. 7, the k-th differential converter cell (comprising the first and second circuitry 700ab) employs two equal resistances $R_k$.

Figure 8:
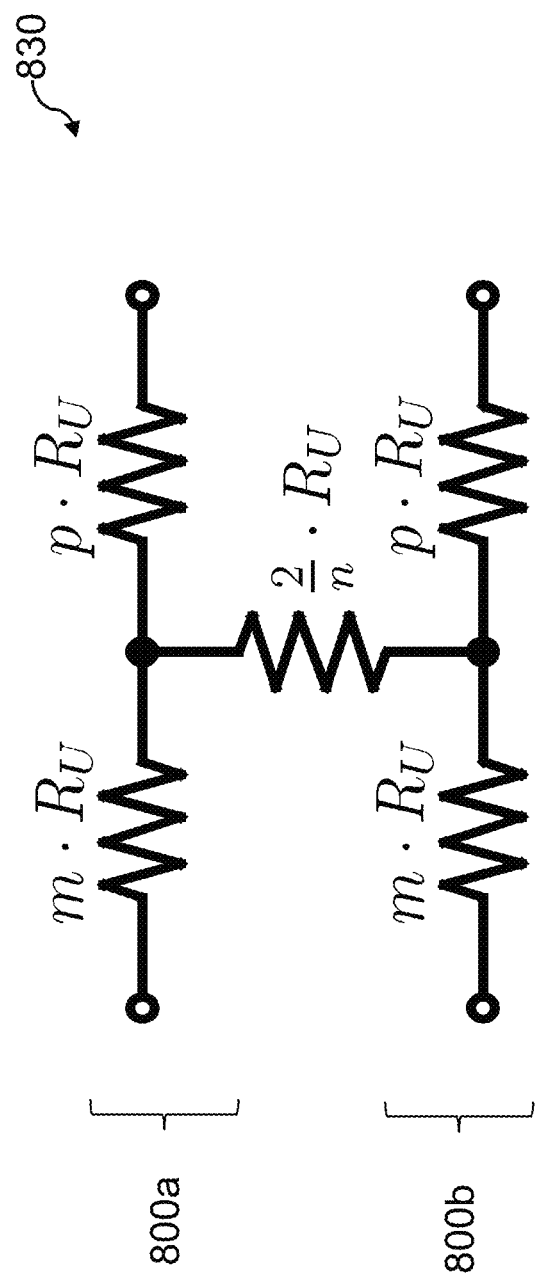
FIG. 8 illustrates another example of a differential system.

FIG. 8 shows another example of a differential system 830 comprising a first circuitry 800a for digital-to-analog conversion and second circuitry 800b for digital-to-analog conversion. The implementation of each of the circuitries 800a, 800b may be similar to the implementation of the circuitry described in connection with FIG. 1-6. The common nodes of the weighting resistor circuits of the first and second circuitry 800a-b are interconnected (rather than being connected to ground potential). An output of the weighting resistor circuit of the first circuitry 800a is configured to supply a first output signal and an output of the weighting resistor circuit of the second circuitry 800b is configured to supply a second output signal. The first and second output signal form a differential signal for the differential system 830. Since the first and second circuitry 800a-b are interconnected via the shunt path (comprising the second resistive sub-circuits) the resistivity of the interconnected shunt path adds to 2/n $R_U$. The resistivities of the first, second and third resistive sub-circuit of each circuitry 800a, 800b may be equal to enable a proper conversion of an incoming differential input.

Compared to the example in FIG. 7, FIG. 8 shows an alternative implementation of a differential system being able to process a differential input. The effective resistance of the differential implementation of FIG. 8 may be equal to the single-ended one shown in FIG. 7. With the differential system having interconnected circuitries, the shunt resistors in the shunt path (for suitable values of n, the number of unit resistors $R_U$ in the shunt path) can be further reduced.

The aspects of the (e.g. single-ended) circuitries and the weighting resistor circuities described above in connection with FIG. 1-6 may Fehler! Verweisquelle konnte nicht gefunden werden. apply equally or similarly to the differential implementation. In a maximum configuration, the differential implementation may require 2·(m+n+p) unit resistors $R_U$ (e.g. if no reduction appears in the shunt path).

Table 3 shows exemplarily differential configurations for m, n, and p being integers for binary scaling based on two single-ended implementations (referred by "$\#R_U$") and for binary scaling based on interconnected circuitries (referred by "$\#R_U$ (reduced)"). Also a comparison to a conventional R-2R differential network is given.

TABLE 3

| K | n | m | p | $\#R_U$ | $\#R_U$ (reduced) | R-2R |
|---|---|---|---|---|---|---|
| 4 | 2 | 1 | 1 | 8 | 5 | 10 |
| 8 | 6 | 1 | 1 | 16 | 7 | 16 |
| 16 | 4 | 1 | 3 | 16 | 10 | 22 |
|  | 3 | 2 | 2 | 14 | 10 | 22 |
| 32 | 7 | 2 | 2 | 22 | 12 | 28 |
| 64 | 15 | 2 | 2 | 38 | 16 | 34 |
| 128 | 8 | 3 | 5 | 32 | 20 | 40 |
| 256 | 4 | 6 | 10 | 40 | 34 | 46 |

Table 4 shows exemplarily differential configurations for m, n, and p being integers for non-binary scaling based on two single-ended implementation (referred by "$\#R_U$") and for non-binary scaling based on interconnected circuitries (referred by "$\#R_U$ (reduced)").

TABLE 4

| K | n | m | p | $\#R_U$ | $\#R_U$ (reduced) |
|---|---|---|---|---|---|
| 5 | 3 | 1 | 1 | 10 | 6 |
| 10 | 8 | 1 | 1 | 20 | 8 |
| 13 | 5 | 1 | 2 | 16 | 9 |
| 15 | 6 | 1 | 2 | 18 | 9 |
| 21 | 9 | 1 | 2 | 24 | 11 |
| 29 | 4 | 2 | 3 | 18 | 12 |
| 60 | 14 | 2 | 2 | 36 | 15 |
|  | 6 | 3 | 3 | 24 | 15 |

Hence, the differential system comprising an interconnection via the common nodes of each of the circuitries can further reduce the number of unit resistors. The previously mentioned extensions to fractional ratios and multiple stages can be also applied for the differential implementation in their respective ways.

Figure 9:
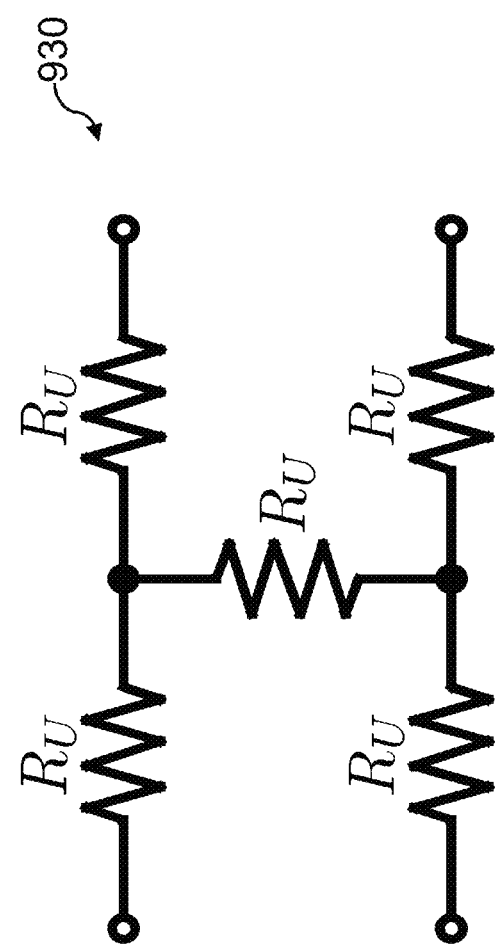
FIG. 9 illustrates another example of a differential system.

FIG. 9 shows another example of a differential (interconnected) system 930 with a scaling factor $K=2^k=4$ and m=1 and n=2 (see also Table 3 for K=4). For the chosen values of m, n, and p the effective resistivity is given by:

$$R_{\mathit{eff}}=R_U(n \cdot m \cdot p+m+p)=R_U(2 \cdot 1+1+1)=R_U \cdot 4.$$

Compared to other conventional differential implementations (e.g. based on linear or R-2R-scaling), the number of shunt paths can be further reduced by the proposed interconnected implementation. For the desired scaling factor of K=4, only five unit resistors may be needed which is significantly lower compared to other conventional scaling architectures (and the differential single-ended configuration).

Figure 10:
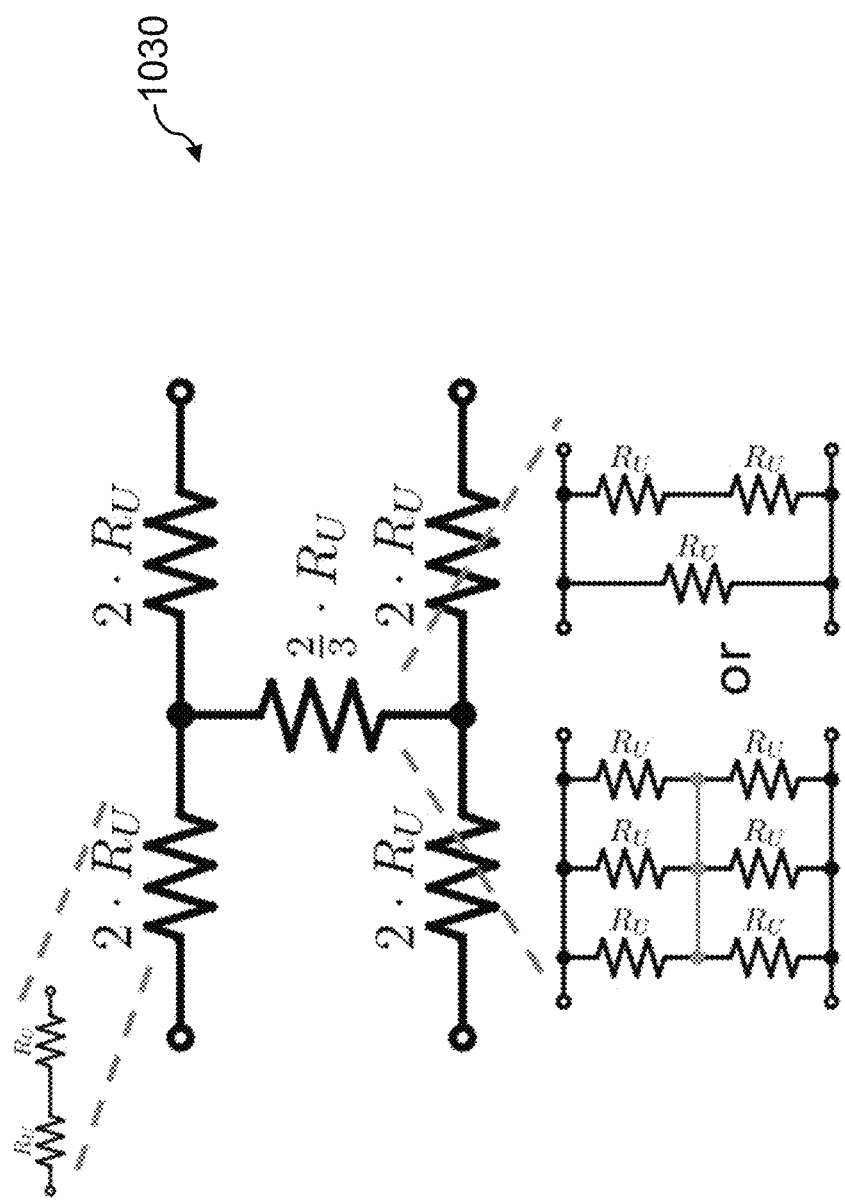
FIG. 10 illustrates another example of a differential system.

FIG. 10 shows an example of a differential (interconnected) system 1030 with a scaling factor $K=2^k=16$ and m=p=2 and n=3 (see also Table 3 for K=16). For the chosen values of m, n, and p the effective resistivity is given by:

$$R_{\mathit{eff}}=R_U(n \cdot m \cdot p+m+p)=R_U(3 \cdot 2 \cdot 2+2+2)=R_U \cdot 16$$

The shunt path with resistivity ⅔ can be partially reduced. FIG. 10 shows two alternative implementations for the shunt path. Hence the total number of unit resistors of the differential system 1030 may be 14 or 11, being significantly lower compared to conventional architectures, and it could be even lower when choosing an asymmetric structure (such that #$R_U$=11). Furthermore, the differential system can be essentially equal (or similar) with respect to the previously described circuitries for digital-to-analog conversion. This may simplify control and equalization of the dynamic behavior between differently scaled circuitries (or called cells).

Figure 11:
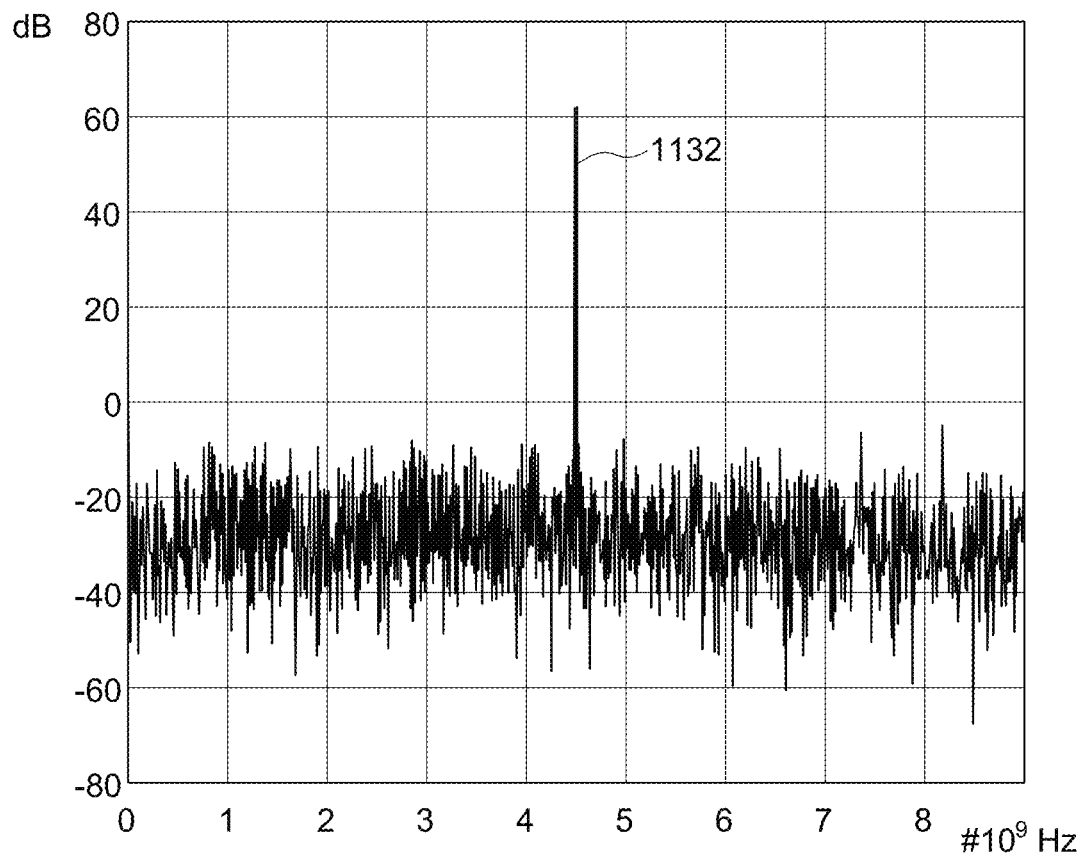
FIG. 11 illustrates an example of a spectrum of a circuitry for digital-to-analog conversion.

FIG. 11 illustrates an example of a frequency spectrum 1132 of a circuitry for digital-to-analog conversion. It shows the simulated dual tone spectrum (including full parasitic extraction) of a circuitry for digital-to-analog conversion using scaled weighting resistor circuits according to the proposed technique. Accordingly, the proposed circuitry is able to exhibit high-performance with, e.g. a spurious-free dynamic range (SFDR)<−67 dBc at 4.4 GHz with −6 dBFS amplitude.

More details and aspects are mentioned in connection with the examples described above or below. The examples shown in FIGS. 7-11 may comprise one or more optional additional features corresponding to one or more aspects mentioned in connection with the proposed technique or one or more examples described above (e.g. FIG. 1-6) or below (e.g. FIGS. 12-15).

As described above, the circuitry for digital-to-analog conversion can be used for DAC systems e.g. to be used to convert a N-bit digital value. The DAC system may comprise one or more circuitries for digital-to-analog conversion. Optionally, the one or more circuitries for digital-to-analog conversion can be used in combination with conventional circuitries for digital-to-analog conversion.

Figure 12:
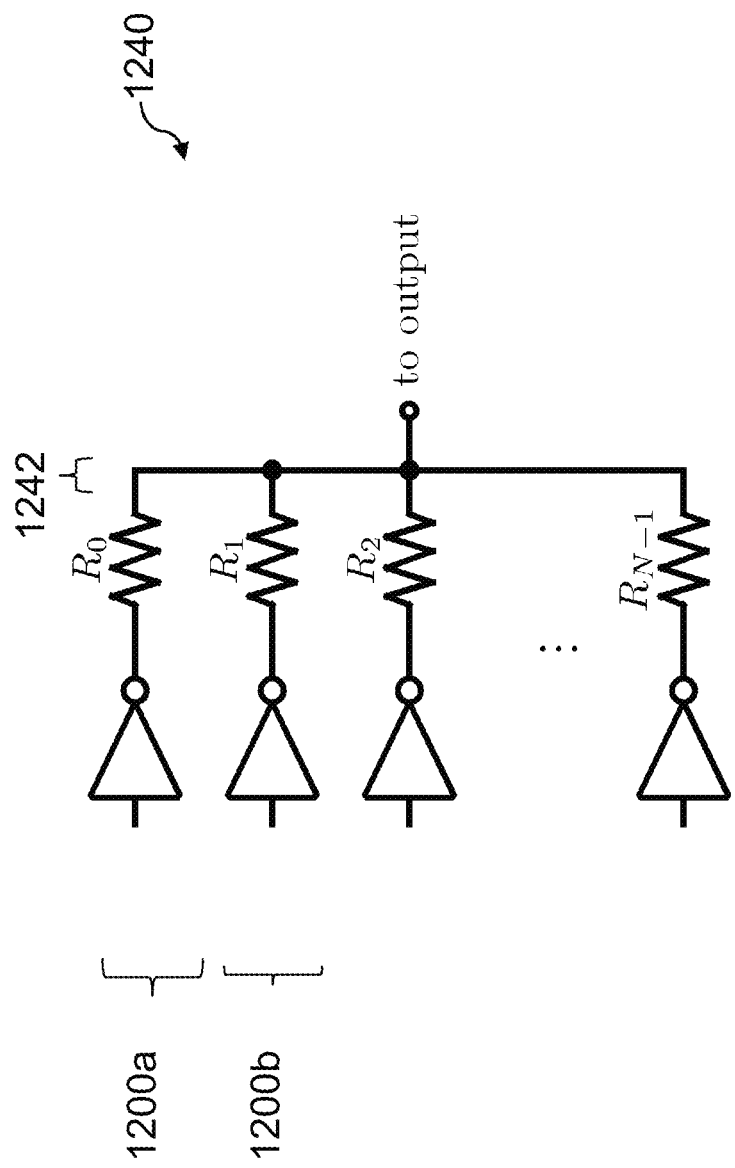
FIG. 12 illustrates an example of a DAC system.

FIG. 12 shows an exemplary implementation of high-performance DAC 1240 with N circuitries for digital-to-analog conversion (or called converter cells), each comprising a driver circuit and a weighting resistor circuit. The DAC system 1240 comprises an input circuitry (not shown) configured to receive a N-Bit digital input and k number of circuitries 1200a, 1200b etc. (according to the proposed technique) which are successively coupled in parallel. Alternatively the DAC system 1240 may comprise k number of differential systems (e.g. based on the single-ended or interconnected implementation as proposed) which are successively coupled in parallel. Each circuitry or differential system is configured to output a respective analog signal based on a respective Bit of the N-Bit digital input. The DAC system 1240 further comprises a combiner circuit 1242 configured to combine the respective analog signals and generate an analog output signal corresponding to the N-Bit digital input.

The number k and N are integers with k≤N. The DAC system comprises at least one or more circuities 1200a, 1200b as proposed (k≥1). In some examples, all of the circuitries 1200a, 1200b for digital-to-analog conversion are based on the proposed technique (k=N). The scaling (and hence effective resistivity of each of the circuitry or differential system) can be equal, similar or different.

For example, the scaling schemes are unary, binary, or a segmented combination thereof or also other schemes are possible. With unary converter cell weighting, all circuitries for digital-to-analog conversion have the same weight, thus employ an equal resistance. Binary scaled cells halve their weights for each successive bit, starting from the most significant to the least significant cell. For example, in a resistive DAC system, the resistance is inversely proportional to the cell weight, thus it doubles each time. Indeed, when scaling the resistance of MSB $R_0$ to the k-th cell with weight $\frac{1}{2^k}$, the required resistance is $R_k=2^k \cdot R_0$. In a DAC with N=4 cells the cell weights (from MSB to LSB) are 1, ½, ¼, and ⅛. The respective resistances are $R_0$, $R_1=2 \cdot R_0$, $R_2=4 \cdot R_0$, and $R_3=8 \cdot R_0$.

Figure 13:
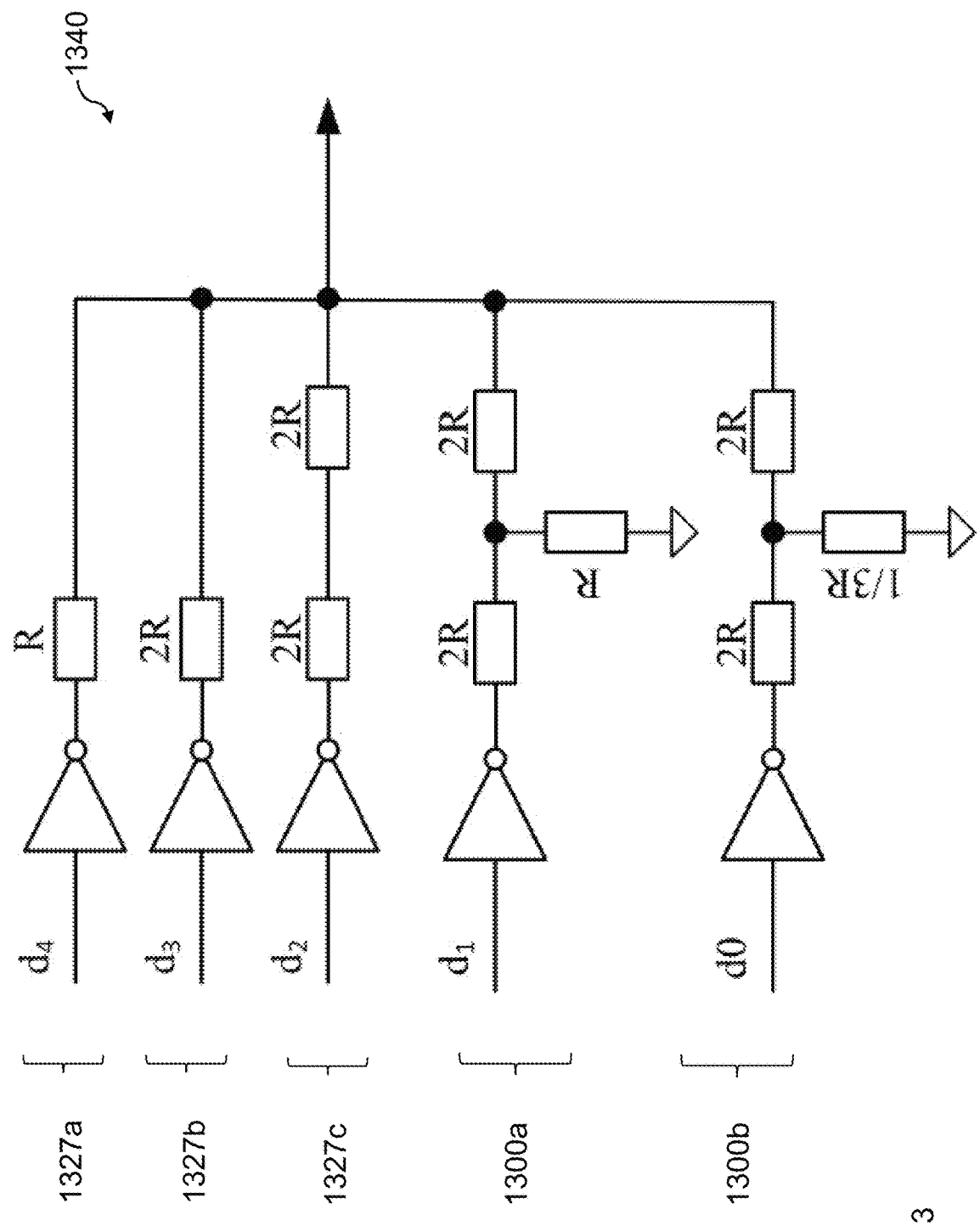
FIG. 13 illustrates an example of a 5-Bit DAC system.

FIG. 13 exemplarily shows a 5-Bit DAC system 1340 (N=5) comprising two circuitries 1300a, 1300b (k=2) for digital-to-analog conversion as proposed. The other converter cells 1327a-c of the DAC system 1300 can be of a conventional type. Hence, the DAC system can be implementable with circuitries 1300a, 1300b for digital-to-analog conversion as proposed in combination with conventional circuits for digital-to-analog conversion 1327a-c.

Figure 14:
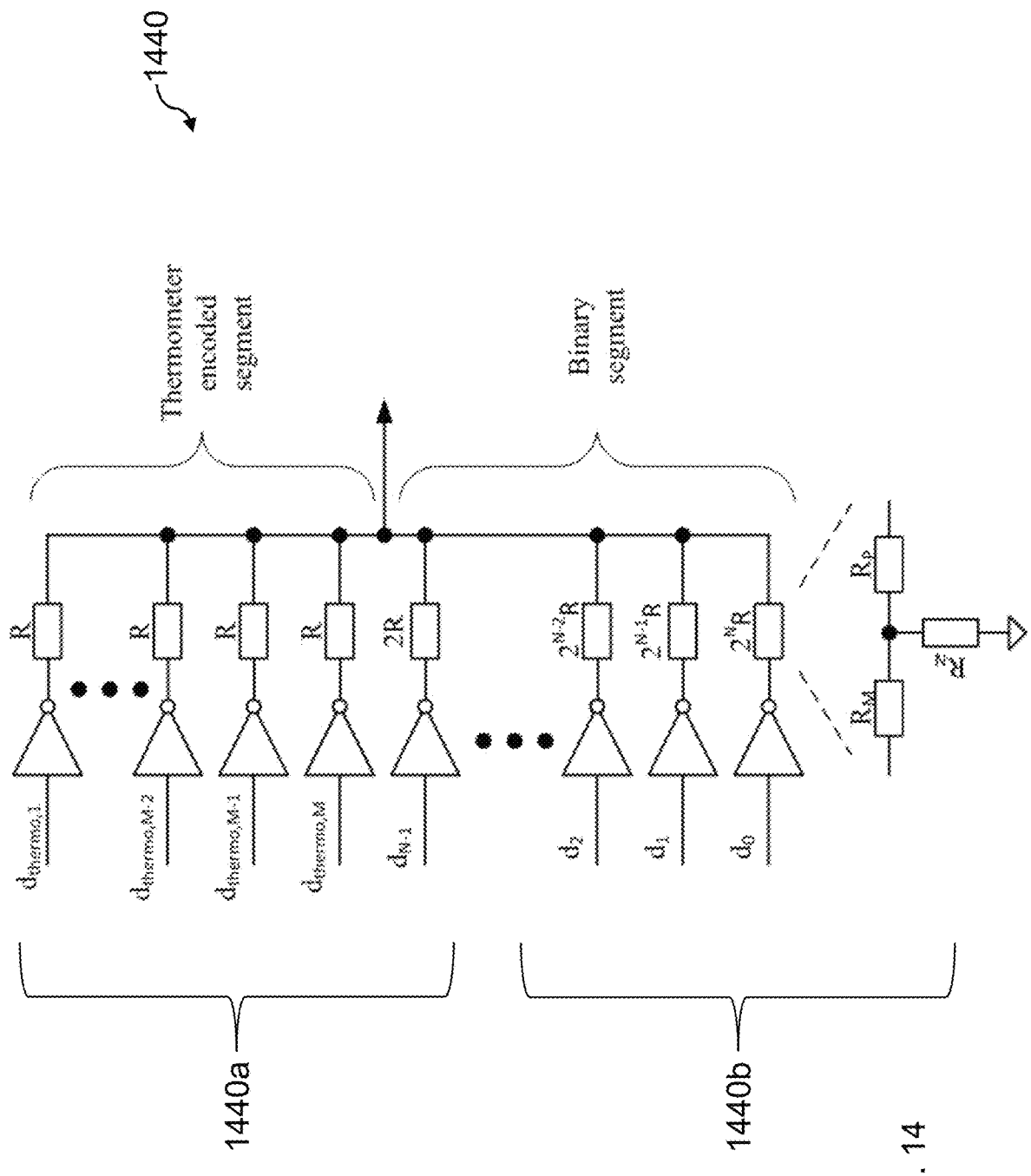
FIG. 14 illustrates another example of a DAC system.

FIG. 14 shows another example of a DAC system 1440. The DAC system 1440 comprises a first unary (or thermometer) based sub-architecture 1440a and a (e.g. binary based) second sub-architecture 1440b. The second sub-architecture 1440b may use one or more circuitries for digital-to-analog conversion according to the proposed architecture. For example, the second sub-architecture may be similar to the implementation described in connection with FIGS. 12-13. Hence, the proposed technique may be also usable with further sub-architecture, e.g. being based on a different resistance scaling. This may be useful to further decrease the total number of resistors in a DAC system.

Figure 15:
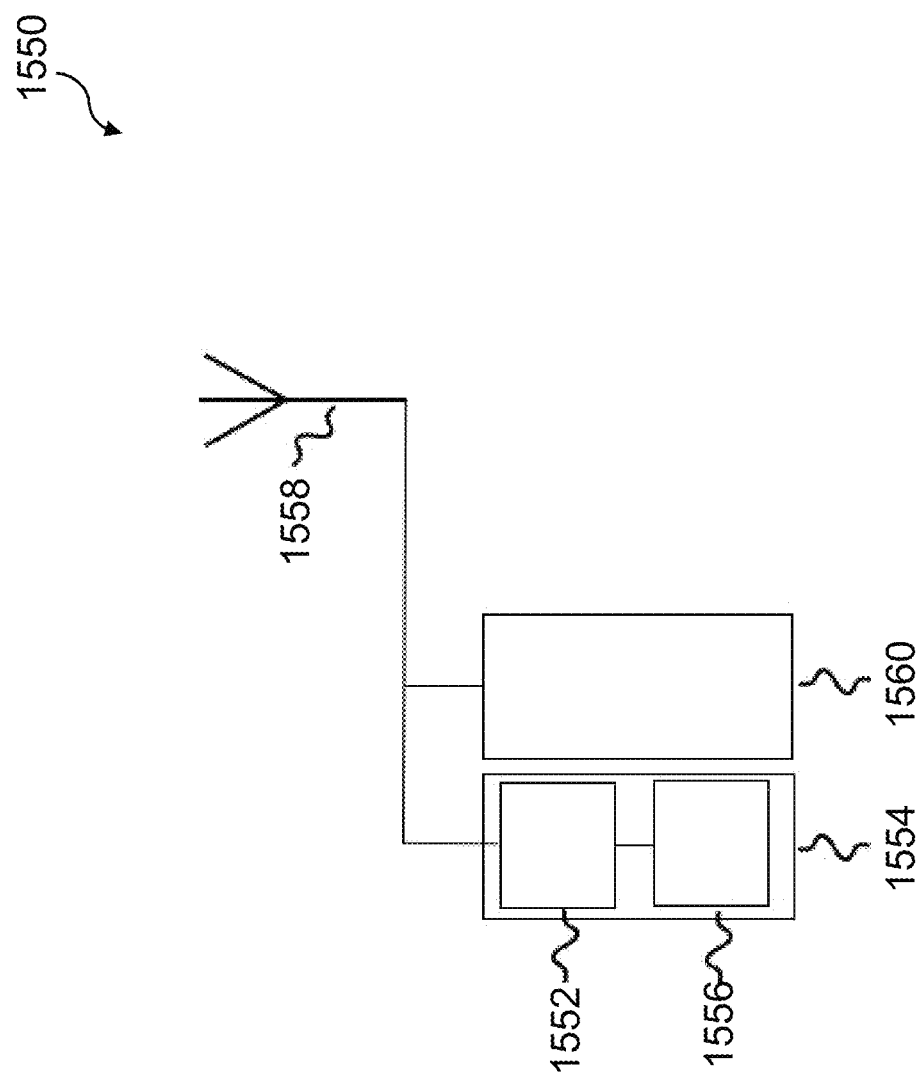
FIG. 15 illustrates an example of a base station.

An example of an implementation using a circuitry for digital-to analog conversion (or differential system or DAC system) according to one or more aspects of the architecture described above in connection with FIGS. 1 to 14 or one or more examples described above in connection with FIGS. 1 to 14 is illustrated in FIG. 15. FIG. 15 schematically illustrates an example of a radio base station 1550 (e.g. for a femtocell, a picocell, a microcell or a macrocell) comprising a circuitry 1552 for digital-to analog conversion (or differential system or DAC system) as proposed.

The circuitry 1552 is part of a transmitter 1554. The transmitter 1554 additionally comprises a digital circuit 1556 configured to supply the digital input to the input of the circuitry 1552. For example, the digital circuit 1556 may be configured to generate the digital input (word) based on data to be wirelessly transmitted.

The base station 1550 comprises at least one antenna element 1558 coupled to the transmitter 1554 for radiating one or more Radio Frequency (RF) transmit signals that are based on the analog output signal of the circuitry 1552 to the environment. For example, the circuitry 1552 may be coupled to the antenna element 1558 via one or more intermediate elements such as a filter, an up-converter (mixer) or a Power Amplifier (PA).

Additionally, the base station 1550 comprises a receiver 1560 configured to receive a RF receive signal from the antenna element 1558 or another antenna element (not illustrated) of the base station 1550.

To this end, a base station comprising a high-speed circuitry for digital-to-analog conversion (or differential system or DAC system) with improved performance for RF transmit signal generation may be provided.

The base station 1550 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 16:
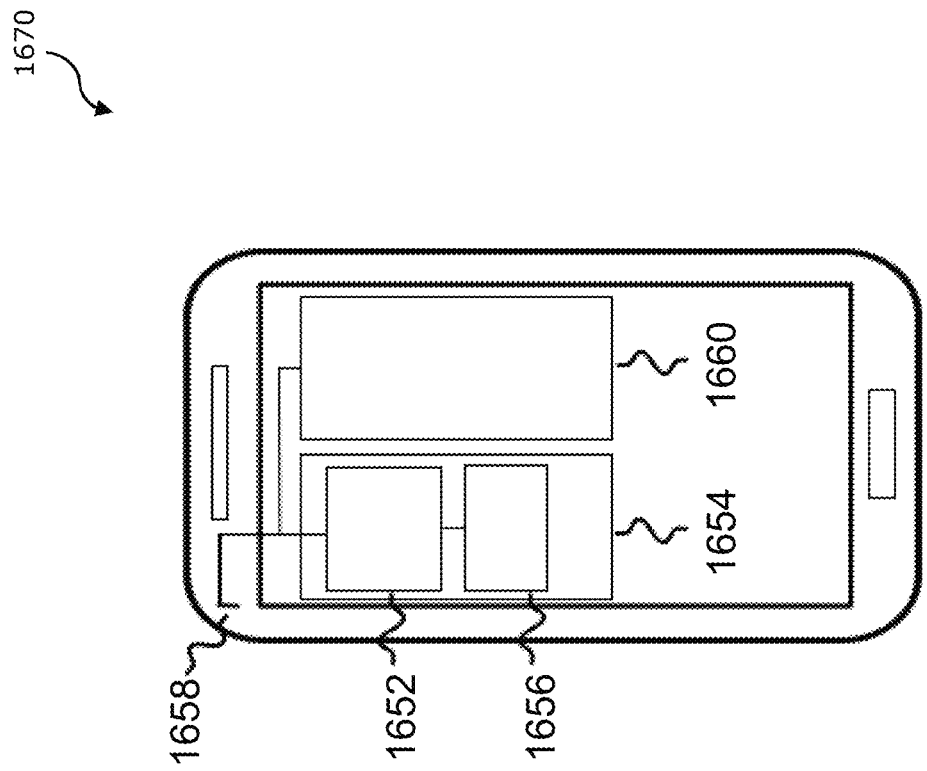
FIG. 16 illustrates an example of a mobile device.

Another implementation using a circuitry for digital-to-analog conversion (or a differential system or a DAC system) according to one or more aspects of the architecture described above in connection with FIGS. 1 to 15 or one or more examples described above in connection with FIGS. 1 to 15 is illustrated in FIG. 16. FIG. 16 schematically illustrates an example of a mobile device 1670 (e.g. mobile phone, smartphone, tablet-computer, or laptop) comprising a circuitry 1652 (or differential system or DAC system) as proposed.

The circuitry 1652 is part of a transmitter 1654. The transmitter 1654 additionally comprises a digital circuit 1656 configured to supply the digital input to the input of the circuitry 1652. For example, the digital circuit 1656 may be configured to generate the digital input (word) based on data to be wirelessly transmitted.

The mobile device 1670 comprises at least one antenna element 1658 coupled to the transmitter 1654 for radiating one or more RF transmit signals that are based on the analog output signal of the circuitry 1652 to the environment. For example, the circuitry 1652 may be coupled to the antenna element 1658 via one or more intermediate elements such as a filter, an up-converter (mixer) or a PA.

Additionally, the mobile device 1670 comprises a receiver 1660 configured to receive a RF receive signal from the antenna element 1658 or another antenna element (not illustrated) of the mobile device 1670.

To this end, a mobile device comprising a high-speed circuitry (or differential system or DAC system) with improved performance for RF transmit signal generation may be provided.

The mobile device 1670 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Some examples relate to a resistor scaling scheme for high-performance DACs.

The proposed resistor scaling for high-performance DACs can provide a method for implementing large scaling factors of resistances. The proposed technique can be used with unit resistors, thus enabling to achieve great static accuracy and eliminating systematic errors. Due to the potential reduction in the number of unit resistors compared to conventional solutions, the silicon area as well as parasitic capacitance can be significantly reduced. The circuit structure can remain the same independently of the scaling factor, thus it can simplify the control and equalization of the dynamic behavior of differently scaled cells.

The examples described herein may be summarized as follows:

An example (e.g. example 1) relates to circuitry for digital-to-analog conversion, comprising: a driver circuit; a weighting resistor circuit coupled to an output of the driver circuit, the weighting resistor circuit comprising: a first resistive sub-circuit coupled to the output of the driver circuit and an intermediate node; a second resistive sub-circuit coupled to the intermediate node and a common node; and a third resistive sub-circuit coupled to the intermediate node and an output of the circuitry, wherein the resistivity of the second resistive sub-circuit is equal to or smaller than the resistivity of the first resistive sub-circuit.

Another example (e.g. example 2) relates to a previously described example (e.g. example 1), wherein the second resistive sub-circuit comprises at least two signal paths coupled in parallel, each signal path being coupled between (or to) the intermediate node and the common node.

Another example (e.g. example 3) relates to a previously described example (e.g. one of the examples 1-2), wherein each resistive sub-circuit comprises a respective number of unit resistors with resistance $R_U$.

Another example (e.g. example 4) relates to a previously described example (e.g. example 3), wherein a resistivity of the first resistive sub-circuit is equal to m $R_U$ related to the respective number of unit resistors, a resistivity of the second resistive sub-circuit is equal to 1/n $R_U$ related to the respective number of unit resistors, a resistivity of the third resistive sub-circuit is equal to p $R_U$ related to the respective number of unit resistors, and a resistivity $R_{eff}$ of the weighting resistor circuit is based on $R_U \cdot (n \cdot m \cdot p + m + p)$.

Another example (e.g. example 5) relates to a previously described example (e.g. example 4), wherein the first resistive sub-circuit comprises m unit resistors coupled in series.

Another example (e.g. example 6) relates to a previously described example (e.g. one of the examples 4-5), wherein the second resistive sub-circuit comprises n unit resistors coupled in parallel.

Another example (e.g. example 7) relates to a previously described example (e.g. one of the examples 4-6), wherein the third resistive sub-circuit comprises p unit resistors coupled in series.

Another example (e.g. example 8) relates to a previously described example (e.g. one of the examples 4-7), wherein a scaling factor $$\frac{R_{eff}}{R_U} = (n \cdot m \cdot p + m + p)$$

of the weighting resistor circuit is based on min(n+m+p) with m, n and p being integers.

Another example (e.g. example 9) relates to a previously described example (e.g. one of the examples 3-7), wherein the respective number of unit resistors of at least one of the first resistive sub-circuit and second resistive sub-circuit and third resistive sub-circuit are coupled in series and in parallel.

Another example (e.g. example 10) relates to a previously described example (e.g. one of the examples 1-9), wherein the first resistive sub-circuit comprises: a first additional resistive sub-circuit coupled between (or to) the output of the driver circuit and an additional intermediate node; a second additional resistive sub-circuit coupled between (or to) the additional intermediate node and a common node; and a third additional resistive sub-circuit coupled between (or to) the additional intermediate node and the intermediate node, wherein the resistivity of the second additional resistive sub-circuit is equal to or smaller than the resistivity of the first additional resistive sub-circuit.

Another example (e.g. example 11) relates to a previously described example (e.g. one of the examples 1-10), wherein the third resistive sub-circuit comprises: a first additional resistive sub-circuit coupled between (or to) the intermediate node and an additional intermediate node; a second additional resistive sub-circuit coupled between (or to) the additional intermediate node and a common node; and a third additional resistive sub-circuit coupled between (or to) the additional intermediate node and the output of the circuitry, wherein the resistivity of the second additional resistive sub-circuit is equal to or smaller than the resistivity of the first additional resistive sub-circuit.

Another example (e.g. example 12) relates to a previously described example (e.g. one of the examples 1-11), wherein the common node is coupled to ground potential.

An example (e.g. example 13) relates to a differential system, comprising: first circuitry and second circuitry each relating to a previously described example (e.g. example 12); wherein an output of the weighting resistor circuit of the first circuitry is configured to supply a first output signal and an output of the weighting resistor circuit of the second circuitry is configured to supply a second output signal, the first and second output signal forming a differential signal for the differential system.

An example (e.g. example 14) relates to a differential system, comprising: first circuitry and second circuitry each relating to a previously described example (e.g. one of the examples 1 to 11); wherein the common nodes of the weighting resistor circuits of the first and second circuitry are interconnected, wherein an output of the weighting resistor circuit of the first circuitry is configured to sup-ply a first output signal and an output of the weighting resistor circuit of the second circuitry is configured to supply a second output signal, the first and second output signal forming a differential signal for the differential system.

An example (e.g. example 15) relates to a digital-to-analog converter, DAC, system, comprising: input circuitry configured to receive a N-Bit digital input; and k number of circuitries, relating to a previously described example (e.g. one of the examples 1 to 12), successively coupled in parallel, or k number of differential systems, relating to a previously described example (e.g. one of the examples 13 or 14), successively coupled in parallel, wherein each circuitry or differential system is configured to output a respective analog signal based on a respective Bit of the N-Bit digital input, wherein k and N are integers with k≤N.

Another example (e.g. example 16) relates to a previously described example (e.g. example 15), further comprising: a combiner circuit configured to combine the respective analog signals and generate an analog output signal corresponding to the N-Bit digital input.

An example (e.g. example 17) relates to a transmitter, comprising: circuitry for digital-to-analog conversion relating to a previously described example (e.g. one of the examples 1 to 12) or a system relating to a previously described example (e.g. one of the examples 13 to 16); and a digital circuit configured to supply the digital input to an input of the circuitry or system.

Another example (e.g. example 18) relates to a previously described example (e.g. example 17), wherein the digital circuit is configured to generate the digital input based on data to be wirelessly transmitted.

An example (e.g. example 19) relates to a base station, comprising: a transmitter relating to a previously described example (e.g. one of the examples 17 or 18); and at least one antenna element coupled to the transmitter.

Another example (e.g. example 20) relates to a previously described example (e.g. example 19), further comprising: a receiver configured to receive a radio frequency receive signal from the antenna element.

An example (e.g. example 21) relates to a mobile device, comprising: a transmitter relating to a previously described example (e.g. one of the examples 17 or 18); and at least one antenna element coupled to the transmitter.

Another example (e.g. example 22) relates to a previously described example (e.g. example 21), further comprising: a receiver configured to receive a radio frequency receive signal from the antenna element.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. Circuitry for digital-to-analog conversion, comprising:
a driver circuit;
a weighting resistor circuit coupled to an output of the driver circuit, the weighting resistor circuit comprising:
a first resistive sub-circuit coupled to the output of the driver circuit and an intermediate node;
a second resistive sub-circuit coupled to the intermediate node and a common node; and
a third resistive sub-circuit coupled to the intermediate node and an output of the circuitry, wherein the resistivity of the second resistive sub-circuit is equal to or smaller than the resistivity of the first resistive sub-circuit, wherein the second resistive sub-circuit comprises at least two signal paths coupled in parallel, each signal path being coupled between the intermediate node and the common node.

2. The circuitry according to claim 1, wherein
each resistive sub-circuit comprises a respective number of unit resistors with resistance $R_U$.

3. The circuitry according to claim 2, wherein
a resistivity of the first resistive sub-circuit is equal to m $R_U$ related to the respective number of unit resistors,
a resistivity of the second resistive sub-circuit is equal to 1/n $R_U$ related to the respective number of unit resistors,
a resistivity of the third resistive sub-circuit is equal to p $R_U$ related to the respective number of unit resistors, and
a resistivity $R_{eff}$ of the weighting resistor circuit is based on $R_U \cdot (n \cdot m \cdot p + m + p)$.

4. The circuitry according to claim 3, wherein
the first resistive sub-circuit comprises m unit resistors coupled in series.

5. The circuitry according to claim 3, wherein
the second resistive sub-circuit comprises n unit resistors coupled in parallel.

6. The circuitry according to claim 3, wherein
the third resistive sub-circuit comprises p unit resistors coupled in series.

7. The circuitry according to claim 3, wherein a scaling factor $$\frac{R_{eff}}{R_U} = (n \cdot m \cdot p + m + p)$$

of the weighting resistor circuit is based on min(n+m+p) with m, n and p being integers.

8. The circuitry according to claim 2, wherein the respective number of unit resistors of at least one of the first resistive sub-circuit and second resistive sub-circuit and third resistive sub-circuit are coupled in series and in parallel.

9. Circuitry for digital-to-analog conversion, comprising:
a driver circuit;
a weighting resistor circuit coupled to an output of the driver circuit, the weighting resistor circuit comprising:
a first resistive sub-circuit coupled to the output of the driver circuit and an intermediate node;
a second resistive sub-circuit coupled to the intermediate node and a common node; and
a third resistive sub-circuit coupled to the intermediate node and an output of the circuitry, wherein the resistivity of the second resistive sub-circuit is equal to or smaller than the resistivity of the first resistive sub-circuit,
wherein the first resistive sub-circuit comprises:
a first additional resistive sub-circuit coupled between the output of the driver circuit and an additional intermediate node;
a second additional resistive sub-circuit coupled between the additional intermediate node and the common node; and
a third additional resistive sub-circuit coupled between the additional intermediate node and the intermediate node, wherein the resistivity of the second additional resistive sub-circuit is equal to or smaller than the resistivity of the first additional resistive sub-circuit.

10. Circuitry for digital-to-analog conversion, comprising:
a driver circuit;
a weighting resistor circuit coupled to an output of the driver circuit, the weighting resistor circuit comprising:
a first resistive sub-circuit coupled to the output of the driver circuit and an intermediate node;
a second resistive sub-circuit coupled to the intermediate node and a common node; and
a third resistive sub-circuit coupled to the intermediate node and an output of the circuitry, wherein the resistivity of the second resistive sub-circuit is equal to or smaller than the resistivity of the first resistive sub-circuit,
wherein the third resistive sub-circuit comprises:
a first additional resistive sub-circuit coupled between the intermediate node and an additional intermediate node;
a second additional resistive sub-circuit coupled between the additional intermediate node and the common node; and
a third additional resistive sub-circuit coupled between the additional intermediate node and the output of the circuitry, wherein the resistivity of the second additional resistive sub-circuit is equal to or smaller than the resistivity of the first additional resistive sub-circuit.

11. The circuitry according to claim 1, wherein the common node is coupled to ground potential.

12. A differential system, comprising:
first circuitry and second circuitry each according to claim 11;
wherein an output of the weighting resistor circuit of the first circuitry is configured to supply a first output signal and an output of the weighting resistor circuit of the second circuitry is configured to supply a second output signal, the first and second output signal forming a differential signal for the differential system.

13. A differential system, comprising:
first circuitry and second circuitry each according to claim 1;
wherein the common nodes of the weighting resistor circuits of the first and second circuitry are interconnected,
wherein an output of the weighting resistor circuit of the first circuitry is configured to supply a first output signal and an output of the weighting resistor circuit of the second circuitry is configured to supply a second output signal, the first and second output signal forming a differential signal for the differential system.

14. A digital-to-analog converter, DAC, system, comprising:
input circuitry configured to receive a N-Bit digital input; and
k number of circuitries, according to claim 1, successively coupled in parallel, wherein each circuitry is configured to output a respective analog signal based on a respective Bit of the N-Bit digital input, wherein k and N are integers with k≤N.

15. The DAC system according to claim 14, further comprising:
a combiner circuit configured to combine the respective analog signals and generate an analog output signal corresponding to the N-Bit digital input.

* * * * *